United States Patent
Guddat et al.

(10) Patent No.: US 6,374,377 B1
(45) Date of Patent: *Apr. 16, 2002

(54) LOW YIELD ANALYSIS OF EMBEDDED MEMORY

(75) Inventors: Douglas A. Guddat, Portland, OR (US); Glenn F. King, Folsom, CA (US); Tim Lambert, Aloha, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/211,986

(22) Filed: Dec. 14, 1998

(51) Int. Cl.[7] .............................................. G11C 29/00
(52) U.S. Cl. ..................................................... 714/718
(58) Field of Search ................... 714/718, 42

(56) References Cited

U.S. PATENT DOCUMENTS

| 4,916,626 A | * | 4/1990 | Vermesse ..................... 714/718 |
| 5,210,860 A | * | 5/1993 | Pfeffer et al. .................. 714/42 |
| 5,781,557 A | | 7/1998 | Greason, et al. ........... 371/21.1 |
| 5,970,013 A | * | 10/1999 | Fischer et al. .......... 365/230.01 |
| 6,085,341 A | | 7/2000 | Greason et al. ............. 714/718 |

* cited by examiner

Primary Examiner—Phung M. Chung
(74) Attorney, Agent, or Firm—Blakely, Sokoloff, Taylor & Zafman LLP

(57) ABSTRACT

A processor includes a plurality of I/O connectors and an embedded memory array having a plurality of memory cells and a plurality of bitlines coupled to the plurality of memory cells. The processor also includes low yield analysis circuitry, coupled to both the embedded memory array and a first connector of the plurality of I/O connectors, to provide a coupling between a portion of the embedded memory array and the first connector.

21 Claims, 6 Drawing Sheets

LOW YIELD ANALYSIS OF EMBEDDED MEMORY

BACKGROUND OF THE INVENTION

1. Field of the Invention

The present invention pertains to memories and memory testing. More particularly, this invention relates to electrical testing of embedded memories.

2. Background

Continual advances in processor technology have led to continual increases in the functionality provided in a single processor chip. One example of such functionality is on-chip memories, often referred to as cache memories. On-chip cache memories provide storage of data and/or instructions as well as various other control and/or address information for use by the execution unit(s) and other internal logic of the processor. These on-chip cache memories are typically very fast memories, with the combination of their speed as well as their close physical locality to the execution unit(s) and other internal logic leading to fast memory accesses for the information stored in these memories.

However, the fabrication of memories does not produce perfect results and, therefore, processors will occasionally be fabricated which have faulty memories. The faults may be complete failure of the memory cells, failure of particular cells, failure of connections between cells, failures of sensing circuits, etc. Therefore, given that processors with such faulty memories may be fabricated, it would be beneficial to provide a way to test the electrical characteristics of the embedded memories to verify their performance (e.g., to determine whether there are any electrical faults within the cells of the embedded memory).

Unfortunately, given the embedded nature of these on-chip memories, it is typically not possible to directly and easily access the inputs and outputs of particular memory cells or sense amplifiers, thereby making testing of the electrical characteristics of the circuits extremely difficult. Thus, analysis of the faulty part of the embedded memory array is difficult to do.

Thus, a need exists for improved testing of embedded memories. The present invention allows for the analysis of known faulty memory cells, bit lines and/or sense amplifiers as detected by traditional memory tests, and/or analysis of intrinsic behavior or electrical characteristics.

SUMMARY OF THE INVENTION

A method and apparatus for electrical testing of embedded memory is described herein. According to one aspect of the present invention, a processor includes a plurality of I/O connectors and an embedded memory array having a plurality of memory cells and a plurality of bitlines coupled to the plurality of memory cells. The processor also includes low yield analysis circuitry, coupled to both the embedded memory array and a first connector of the plurality of I/O connectors, to provide a coupling between a portion of the embedded memory array and the first connector.

According to one aspect of the present invention, a method, in a processor, includes receiving a low yield analysis control command and control command parameters from a source external to the processor. Low yield analysis circuitry within the processor is enabled, and a first signal is asserted, based on the control command parameters, to a plurality of multiplexers of the low yield analysis circuitry to couple a first set of inputs to the plurality of multiplexers to the outputs of the plurality of multiplexers. A second signal is asserted, based on the control command parameters, to a plurality of transmission gates to enable a selected one of the plurality of transmission gates to couple the output of one of the plurality of multiplexers to an I/O connector.

BRIEF DESCRIPTION OF THE DRAWINGS

The present invention is illustrated by way of example and not limitation in the figures of the accompanying drawings, in which like references indicate similar elements and in which:

FIG. 5 is a flowchart illustrating the process followed in carrying out an LYA Strobe command by the processor of FIG. 1 according to one embodiment of the present on.

DETAILED DESCRIPTION

In the following description, various aspects of the present invention will be described. However, it will be understood by those skilled in the art that the present invention may be practiced with only some or all aspects of the present invention. For purposes of explanation, specific numbers, materials and configurations are set forth in order to provide a thorough understanding of the present invention. However, it will also be apparent to those skilled in the art that the present invention may be practiced without these specific details.

In the discussions to follow, various operations will be described as multiple discrete steps in turn in a manner that is helpful in understanding the present invention. However, the order of description should not be construed as to imply that these operations are necessarily order dependent, in particular, the order of their presentations.

The present invention provides a method and apparatus for low yield analysis testing of embedded memories. When placed in a testing mode, the memory cells of the embedded array can be accessed individually and externally from the processor. This allows the use of testing equipment to test the electrical characteristics of the individual cells (that is, perform a "low yield analysis"). Furthermore, the electrical characteristics of the bit lines in the embedded memory, the sense amplifier, and the low yield analysis circuitry itself, can also be tested to further assist testers in identifying where errors or problems exist.

Figure 1:
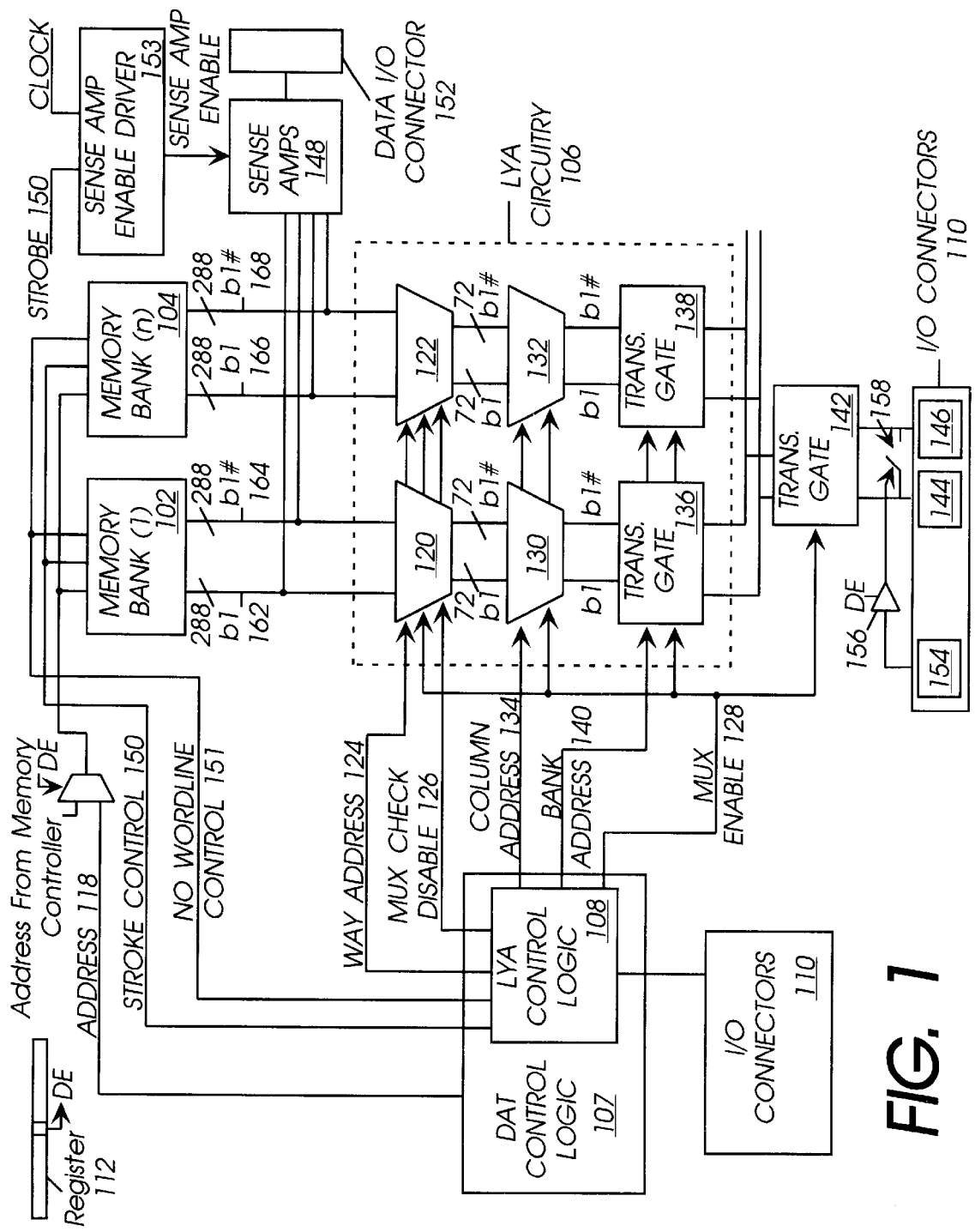
FIG. 1 is a block diagram illustrating circuitry for providing electrical testability of embedded memory in a processor according to one embodiment of the present invention.

FIG. 1 is a block diagram illustrating the circuitry for providing electrical testability of embedded memory in a processor according to one embodiment of the present invention. As illustrated, processor 100 includes multiple (n) memory banks 102 and 104 of an embedded memory array, low yield an access test (DAT) control logic 107 (including LYA control logic 108), and LYA input/output (I/O) connectors 110, coupled together as illustrated. It is to be appreciated that processor 100 includes additional logic and circuitry, such as registers, execution unit(s), etc. However, this additional logic and circuitry has not been shown so as not to clutter the drawings.

The memory banks 102 and 104 can be part of any of a wide variety of conventional memory arrays embedded in a processor. "Embedded" memory arrays refer to memory arrays that are physically part of the processor chip package, such as the instruction cache (also referred to as the instruction fetch unit), data cache, and branch target buffer. In one implementation, the memory banks 102 and 104 are made up of static random access memory (SRAM) cells.

According to one embodiment of the present invention, the memory banks 102 and 104 are the memory array of a data cache unit. The data cache unit also includes a tag portion (not shown) and a control portion (not shown), and stores data which is used, or expected to be used, by the execution unit(s) of processor 100. Data caches are well-known to those skilled in the art and thus will not be discussed further except as they pertain to the present invention.

I/O connectors 110 provide the input and output connections that are used for LYA testing. It is to be appreciated that processor 100 includes additional input and output connections. However, these additional connections have not been shown so as not to clutter the drawings. Address, data, and control information for LYA testing is input to and output from processor 100 via external I/O connectors 110.

In one implementation, external I/O connectors 110 are a plurality of pins which interface between an external circuit board and processor 100. However, in alternate implementations different connecting mechanisms or devices are used. In one such alternate implementation, processor 100 is designed to be surface mounted to a circuit board without the use of pins. In this alternate implementation, external I/O connectors 110 are electrical connection points which, when processor 100 is affixed to the circuit board, are placed in electrical contact with the signal lines on the circuit board.

According to one embodiment of the present invention, processor 100 can function in either a DAT mode or a "normal" mode. DAT mode is a direct access test mode which makes the embedded memories externally directly accessible. The LYA testing in accordance with the present invention is part of the DAT mode. In DAT mode, external commands can directly read from and write to particular locations within the embedded memories. Normal mode refers to the normal operating mode (non-DAT mode) of processor 100, in which the embedded memories are not externally directly accessible. A further discussion of DAT mode, including writing data to memory cells and reading data from memory cells when in DAT mode, can be found in co-pending application Ser. No. 08/948,716, entitled "Method and Apparatus for Direct Access Test of Embedded Memory".

According to one embodiment of the present invention, processor 100 is initialized into either DAT mode or normal mode at system reset based on a particular signal from the external bus (e.g., via one of the pins normally used for addressing). If the signal is in a first state (e.g., asserted) then processor 100 is operating in DAT mode; otherwise, processor 100 is operating in normal mode. Alternatively, the processor 100 may be placed into DAT mode during normal operation, rather than at system reset. In one implementation the value of this signal is stored as a single bit in a configuration register 112 during reset and is used during operation of processor 100 to enable or disable various signal drivers, as discussed in more detail below.

In the illustrated embodiment, the processor is placed into DAT mode or normal mode by external configuration logic. In alternate embodiments, the processor is placed into DAT or normal mode by a signal that is hardwired to a particular value, tied to a value in a Flash memory device or other EEPROM, configurable using jumpers, etc.

Address, control, and data signals are provided to DAT control logic 107 via I/O connectors 110. When processor 100 is operating in DAT mode, address and control signals are routed to the LYA circuitry 106 and to the memory banks 102 and 104 from DAT control logic 107. However, when operating in normal mode, DAT control logic 107 in general, and LYA control logic 108 in particular, do not alter any address, control, or data signals. Thus, when operating in normal mode, signals are routed to the normal internal circuitry for normal operation of processor 100 and DAT control logic 107 does not affect the operation of the processor 100. Thus, it is to be appreciated that the I/O connectors 110 provide input and/or output of signals having different meanings, depending on whether the processor is operating in DAT or normal mode.

Upon receipt of an LYA control command by DAT control logic 107, the command is provided to LYA control logic 108, which in turn provides the appropriate (based on the command received) set address, way address, column address, and bank address signals to the LYA circuitry 106 and the memory banks 102 and 104. Different LYA control commands can be provided to DAT control logic 107 that allow isolation of a particular cell within one of the memory banks 102 and 104, isolation of the particular bitlines of the memory banks 102 and 104, isolation of a particular sense amplifier 148, or isolation of the LYA circuitry 106. The ability to isolate particular cells, bitlines, sense amplifiers, or the LYA circuitry 106 allow the electrical characteristics of the memory arrays as well as the LYA circuitry itself to be tested and its performance and design evaluated.

In the illustrated embodiment, address and control signals are input to the memory banks 102 and 104 from LYA control logic 108. Additional address and control signals from the array controller of the processor (not shown) are also input to the memory banks. In one implementation, these signals from the other portions of the processor are multiplexed with the signals from DAT control logic 107 by multiplexers 114 and 116, and selected ones of the signals are forwarded to the memory arrays. In this implementation, the DAT enable (DE) signal is used to select the signals from DAT control logic 107 as the inputs to the memory array rather than the signals from other sources.

In the illustrated embodiment, four different LYA control commands can be provided to LYA control logic 108 via I/O connectors 110. These commands and a summary of the results of the commands is given in Table I.

TABLE I

| Command | Description |
|---------|-------------|
| LYA Read | The identified memory cell is DC-coupled to the I/O connectors for DC testing. |
| LYA No | The identified bitlines, but not the memory cell, are DC- |

TABLE I-continued

| Command | Description |
| --- | --- |
| Wordline | coupled to the I/O connectors for testing. |
| LYA Multiplexer Check | The identified multiplexer pathways, but not the bitlines or memory cells, are DC-coupled to the I/O connectors for testing. |
| LYA Strobe | The identified sense amplifier internal nodes, but not the memory cell, is DC-coupled to the I/O connectors for testing. |

An additional "tester calibration" option is also provided in accordance with the present invention. However, as discussed in more detail below, this calibration option is not a command input to the LYA control logic 108 in the illustrated embodiment.

In the illustrated embodiment, the memory banks 102 and 104 are part of a four-way set associative cache memory array. The parameters of the LYA Read command include a set identifier, a way identifier, a column identifier, and a bank identifier, which together uniquely identify a particular cell within one of the memory banks 102 and 104. According to one implementation, the set identifier, way identifier, column identifier, and bank identifier parameters are the set address, way address, column address, and bank address, respectively, of the particular cell to be accessed.

Figure 2:
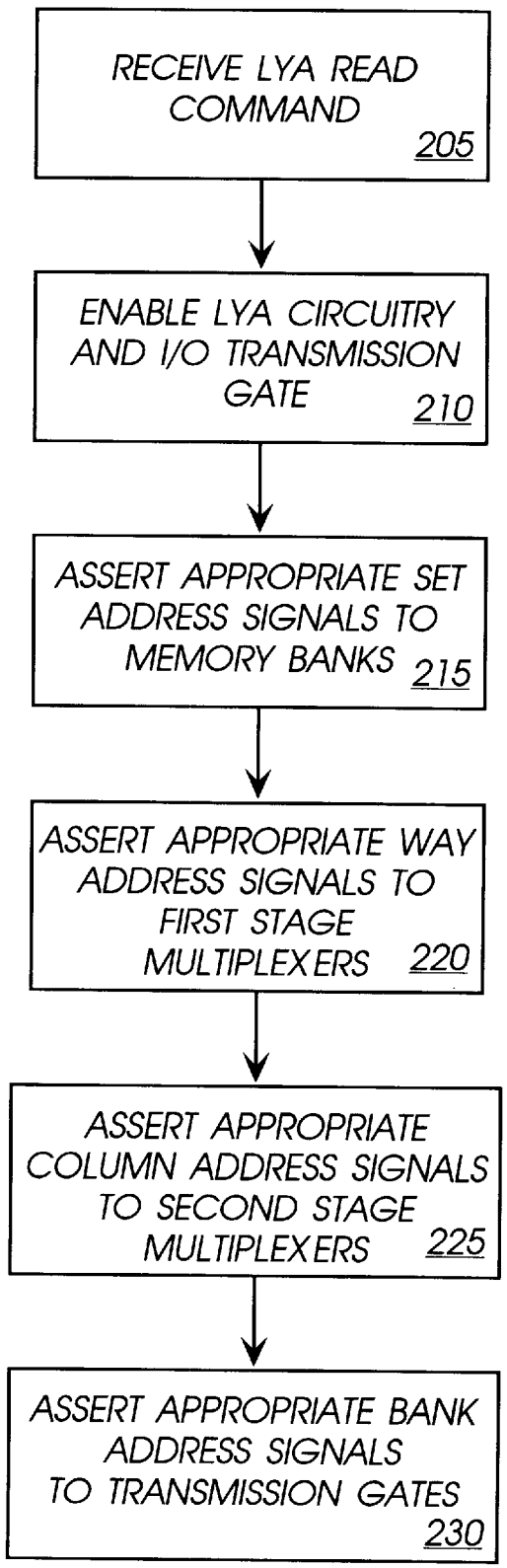
FIG. 2 is a flowchart illustrating the process followed in carrying out an LYA Read command by the processor of FIG. 1 according to one embodiment of the present invention.

FIG. 2 is a flowchart illustrating the process followed in carrying out an LYA Read command by the processor 100 of FIG. 1 according to one embodiment of the present invention. The LYA control logic 108 first receives the LYA Read command, step 205. Upon receipt of the LYA Read command, the LYA control logic 108 enables the LYA circuitry 106 and the 110 transmission gate 142, step 210, by asserting the multiplexer enable signal 128. In the illustrated embodiment of FIG. 1, assertion of the multiplexer enable signal 128 enables the "first stage" multiplexers 120 and 122, the "second stage" multiplexers 130 and 132, and the transmission gates 136, 138, and 142, thereby allowing signals from a particular cell of the memory banks 102 and 104 to be coupled to the I/O connectors 144 and 146.

The LYA control logic 108 then determines the set address to be accessed based on the received set identifier, and asserts the set address signals 118, which are provided to the memory banks 102 and 104 via multiplexer 114, step 215. This causes the bitlines (bl) 162 and 166 and the inverse bitlines (bl#) 164 and 168 of the memory cells from the identified set to be connected to the multiplexers 120 and 122. Multiplexers 120 and 122, being the first set of multiplexers in the LYA circuitry 106 through which signals from the memory banks 102 and 104 pass, are referred to as the "first stage" of multiplexers in the LYA circuitry 106.

The LYA control logic 108 determines the way address to be accessed based on the received way identifier, and asserts the way address signals 124 to the multiplexers 120 and 122, step 220. The multiplexers 120 and 122 are m to 1 (m:1) multiplexers, where m is equal to the number of ways in the cache memory. In the illustrated embodiment, the embedded memory array is a four-way set associative cache memory, so the multiplexers 120 and 122 represent 4:1 multiplexers. It is to be appreciated that multiple 4:1 multiplexers are represented by multiplexers 120 and 122, with the actual number of multiplexers being dependent on the number of inputs received from each way.

Additionally, the multiplexers 120 and 122 also include conventional pull-up circuitry (not shown) that forces the non-selected bitlines 162 and 166 and the non-selected inverse bitlines 164 and 168 to a known state (e.g., $V_{cc}$) This ensures that the non-selected bitlines are sustained in a known state (thereby allowing, for example, determination of leakages).

The LYA control logic 108 also de-asserts the multiplexer check disable signal 126 in step 220, leaving the multiplexers 120 and 122 enabled. Thus, the bitlines 162, 164, 166, and 168 of the memory cells from the identified way in the identified set are connected to the multiplexers 130 and 132 via the multiplexers 120 and 122, respectively. Multiplexers 130 and 132, being the second set of multiplexers in the LYA circuitry 106 through which signals from the memory banks 102 and 104 pass, are referred to as the "second stage" of multiplexers in the LYA circuitry 106.

The LYA control logic 108 determines the column to be accessed based on the received column identifier. The LYA control logic 108 asserts the column address signals 134 to the multiplexers 130 and 132, step 225. The column address signals 134 cause the bitlines 162, 164, 166, and 168 that were connected through the multiplexers 120 and 122 to the multiplexers 130 and 132 to be connected to the transmission gates 136 and 138. As illustrated, the multiplexers 130 and 132 represent 72:1 multiplexers, due to the memory banks 102 and 104 including 288 columns of memory cells used in a 4-way cache memory. Alternate embodiments can use multiplexers with different numbers of inputs, depending on the number of columns in the memory cells and the number of ways in the cache memory. It is to be appreciated that each of the multiplexers 130 and 132 of FIG. 1 represent two multiplexers, one for the bitlines and one for the inverse bitlines.

The LYA control logic determines which of the banks 102 and 104 is to be accessed based on a bank selection address provided to the DAT control logic 107. The LYA control logic 108 then asserts the bank address signals 140 to the transmission gates 136 and 138, step 230. The bank address signals 140 enable a particular one of the transmission gates 136 and 138, thereby allowing only one set of bl and bl# signal lines to be connected to the transmission gate 142. Thus, the LYA circuitry 106 couples one of the cells from one of the memory banks 102 and 104 to the transmission gate 142.

The multiplexer enable signal 128, asserted in step 210, enables transmission gate 142 to couple the signals from the transmission gates 136 and 138 to the I/O connectors 144 and 146. Thus, by using the LYA Read command, a particular cell within the embedded memory can be identified and coupled directly to the I/O connectors, allowing the electrical characteristics of that particular cell to be evaluated externally.

By providing a DC-coupling between individual memory cells of the memory banks and the I/O connectors 144 and 146, the electrical characteristics of the memory cells can be verified and potential faults discovered. For example, the cell write trip point can be identified, opens in transistors can be identified, leakages or shorts in transistors can be identified, high resistances in transistors can be identified, cell nodes being stuck can be identified, etc.

It is to be appreciated that when using the LYA Read command in the processor 100, it may be difficult to distinguish between a fault in a particular memory cell and a fault in the bitlines or inverse bitlines themselves. The LYA No Wordline command allows such distinctions to be made.

Figure 3:
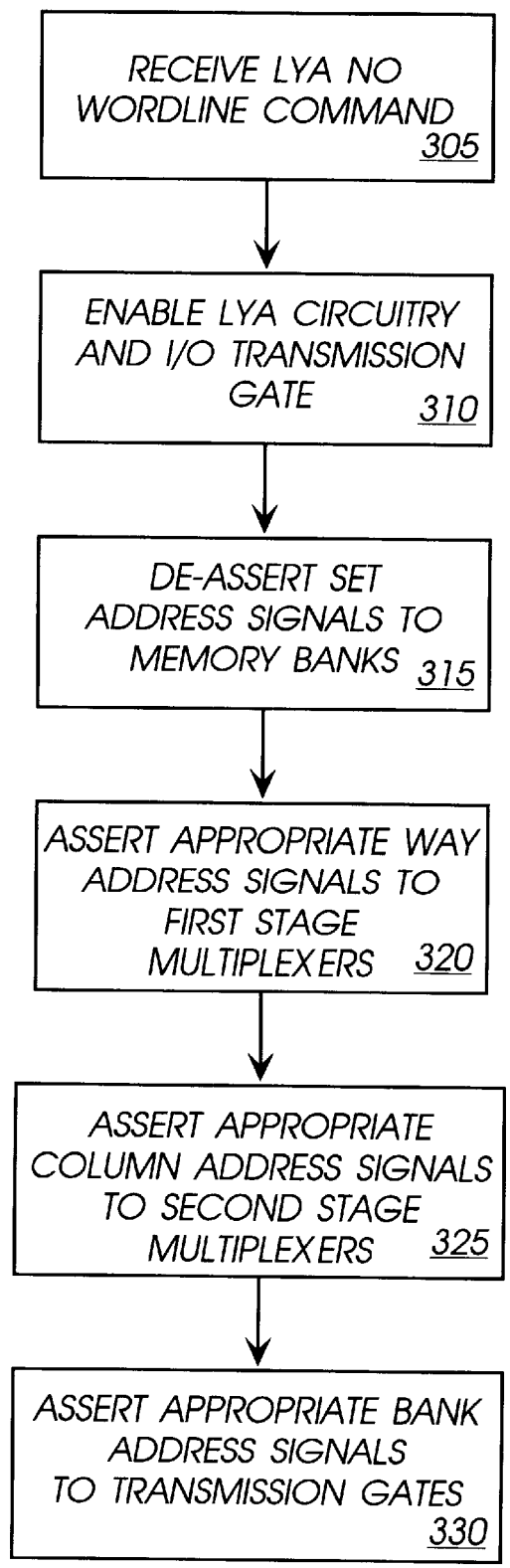
FIG. 3 is a flowchart illustrating the process followed in carrying out an LYA No Wordline command by the processor of FIG. 1 according to one embodiment of the present invention.

FIG. 3 is a flowchart illustrating the process followed in carrying out an LYA No Wordline command by the processor 100 of FIG. 1 according to one embodiment of the present invention. The LYA No Wordline command is first received by the LYA control logic 108, step 305. As parameters for the LYA No Wordline command, the LYA control logic 108 receives a set identifier, a way identifier a column identifier, and a bank identifier, analogous to the LYA Read command discussed above. The LYA control logic 108 responds to the LYA No Wordline command in a similar manner to its response to the LYA Read command discussed above with reference to FIG. 2. The LYA circuitry 106 and transmission gate 142 are enabled, step 310. However, the set address signals 118 to the memory banks 102 and 104 are de-asserted, step 315. The set address signals 118 are the wordline inputs to the individual cells of the memory banks 102 and 104. Therefore, by de-asserting all of the set address signals 118, none of the individual cells of banks 102 and 104 is enabled. Alternatively, rather than de-asserting the set address signals, the set address signals could be asserted but the wordline not turned on (e.g., de-assert a wordline enable signal provided to the banks 102 and 104 via the no wordline control signal 151, thereby preventing the address signals 118 from being provided to the cells). Thus, the bitlines 162, 164, 166, and 168 themselves are coupled to the multiplexers 120 and 122, however, no particular memory cell coupled to those bitlines is selected.

The LYA control logic 108 also asserts the appropriate way address to the first stage multiplexers 120 and 122 (step 320), the appropriate column address signals to the second stage multiplexers 130 and 132 (step 325), and the appropriate bank address signals to the transmission gates 136 and 138 (step 330), analogous to steps 220, 225, and 230 of FIG. 2, respectively.

Therefore, using the LYA No Wordline command, the bitlines and inverse bitlines 162, 164, 166, and 168 can be checked for problems (e.g., electrical shorts or leakages) without being affected by the memory cells themselves. In other words, the LYA No Wordline command allows the bitlines and inverse bitlines 162, 164, 166, and 168 to be isolated from the memory cells for testing. The bitlines can be tested by putting the bitlines in various binary states and checking for leakage over what is expected due to sub-$v_T$ or junction leakage. Writing of particular data ("pre-conditioning") to the cells of banks 102 and 104 may be performed before the LYA No Wordline command is issued. This pre-conditioning/writing can be done in a variety of different manners, such as by using the method described in co-pending application Ser. No. 08/948,716.

It is to be appreciated that when using either the LYA Read command or the LYA No Wordline command in the processor 100, situations may arise where no fault exists in the cells of the memory banks 102 and 104, or in the bitlines and inverse bitlines 162, 164, 166, and 168, however there is a fault in the LYA circuitry 106. These situations can result in the appearance, from the signals detected at the connectors 144 and 146, that there is a fault with a memory cell or bitline because of the error introduced by the LYA circuitry 106 as the signals pass from the memory cells to the connectors 144 and 146.

Figure 4:
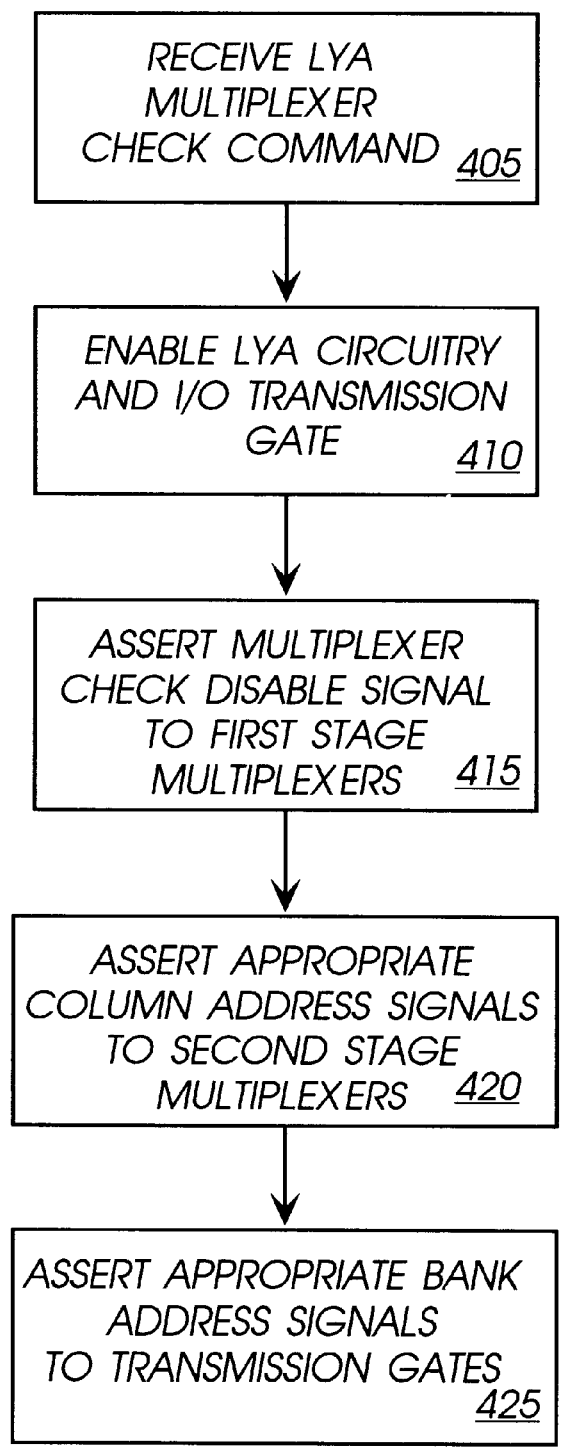
FIG. 4 is a flowchart illustrating the process followed in carrying out an LYA Muliplexer Check command by the processor of FIG. 1 according to one embodiment of the present invention.

The LYA Multiplexer Check command allows such situations to be identified. FIG. 4 is a flowchart illustrating the process followed in carrying out an LYA Multiplexer Check command by the processor 100 of FIG. 1 according to one embodiment of the present invention. The LYA control logic 108 receives the LYA Multiplexer Check command, step 405, which includes the set identifier, way identifier, column identifier, and bank identifier as parameters. The LYA control logic 108 asserts the multiplexer enable signal 128 to enable the LYA circuitry 106 and the transmission gate 142, step 410. The LYA control logic 108 also asserts the multiplexer check disable signal 126, step 415, thereby disabling the first stage multiplexers 120 and 122. The LYA control logic 108 also asserts the appropriate column address signals to the second stage multiplexers 130 and 132 (step 420), and asserts the appropriate bank address signals to the transmission gates 136 and 138 (step 425), analogous to steps 225 and 230 of FIG. 2, respectively. Disabling the first stage multiplexers 120 and 122 effectively couples the connection path from the multiplexers 120 and 122 through to the transmission gate 142 to the connectors 144 and 146, while isolating the same connection path from influence by the memory cells, bitlines, and inverse bitlines of the memory banks 102 and 104. Thus, errors within the LYA circuitry 106 can be detected without interference from possible errors in the memory banks 102 and 104 or bitlines 162, 164, 166, or 168.

The LYA Multiplexer Check command can be used to verify that a leakage signature for a column is in fact due to an array defect by changing the LYA command from LYA Read or LYA No Wordline to LYA Multiplexer Check. There should be no current measured for a LYA Multiplexer Check command (thus, for example, devices not turning off can be identified, and junction or device leakages or defects in the path that are not associated with the memory array can be identified). The LYA Multiplexer Check command can also be used to detect errors in the LYA circuitry by scanning through all addresses, looking for a leakage.

Additionally, the bitlines and inverse bitlines from the memory banks 102 and 104 are input to sense amplifiers 148, which identify the actual value of the cell coupled to the bitlines and inverse bitlines based on the voltage differential between the signals on the bitlines and inverse bitlines. The sense amplifiers 148 are well known to those skilled in the art, and thus will not be discussed further except as they pertain to the present invention.

It is to be appreciated that the sense amplifiers 148 can also be faulty. Since the LYA Read, LYA No Wordline, and LYA Multiplexer Check commands couple signals to I/O connectors 144 and 146 via LYA circuitry 106, these commands would not detect errors in the sense amplifiers 148. However, an LYA Strobe command is used to detect such errors.

Figure 5:
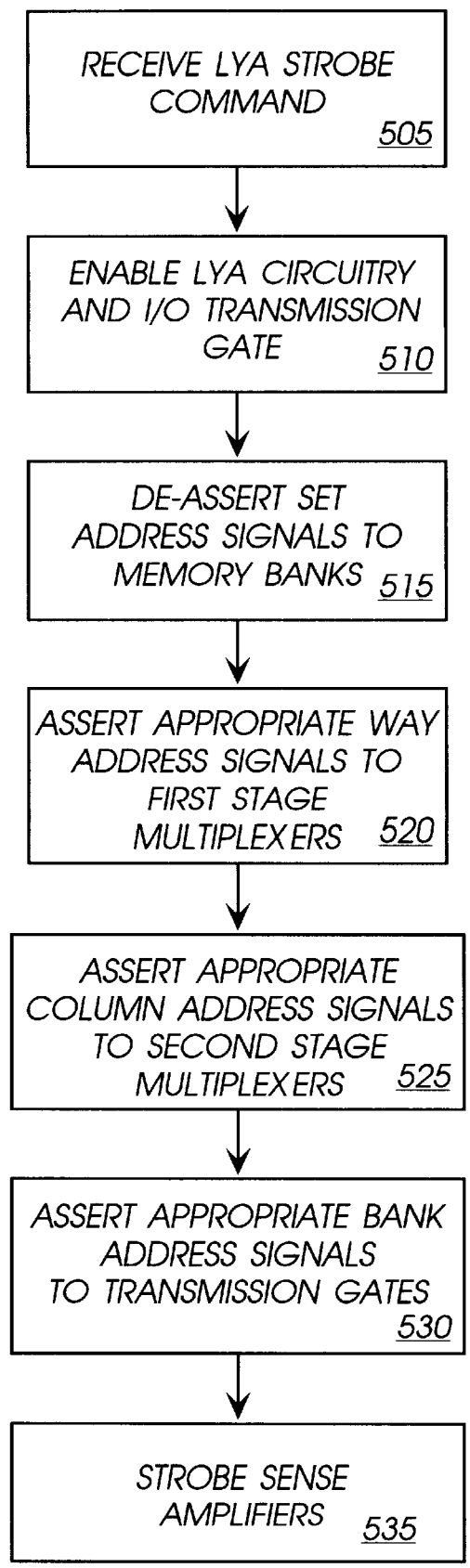

FIG. 5 is a flowchart illustrating the process followed in carrying out an LYA Strobe command by the processor 100 of FIG. 1 according to one embodiment of the present invention. The LYA control logic 108 receives the LYA Strobe command, including as parameters the set identifier, way identifier, column identifier, and bank identifier for a particular cell in one of the memory banks 102 and 104, step 505. The LYA control logic 108 enables the LYA circuitry 106 and the 110 transmission gate 142 (step 510), de-asserts the set address signals 118 (or turns the wordlines off) to the memory banks 102 and 104 (step 515), asserts the appropriate way address signals 124 to the first stage multiplexers 120 and 122 (step 520), asserts the appropriate column address signals 134 to the second stage multiplexers 130 and 132 (step 525), and asserts the appropriate bank address signals to the transmission gates 136 and 138, analogous to steps 310, 315, 320, 325, and 330 of FIG. 3, respectively. The LYA control logic 108 also uses the received set, way, column, and bank identifiers to determine which of the sense amplifiers 148 is to be connected to the LYA I/O connectors and strobes the sense amplifiers, step 535. As illustrated, the sense amplifiers 148 can be enabled by the strobe control signal 150 from the DAT control logic 107 input to the sense amplifier enable driver 153.

By coupling the bitline and inverse bitline corresponding to a particular cell to the connectors 144 and 146, signals can be provided to the bitline and inverse bitline via the connectors 144 and 146. These signals, propagating from the connectors 144 and 146 through the LYA circuitry 106, are then sensed by the sense amplifiers 148 when strobed, with the sensed value being output to the data bus via the data I/O connectors 152 coupled to the sense amplifiers 148. Thus, given that the tester knows what values were input to the sense amplifiers 148, the tester can evaluate the performance of the sense amplifiers, such as measuring the DC offset of the sense amplifiers. Further, given that the wordlines to the memory banks are not enabled, the values stored in the memory cells do not interfere with the evaluation of the sense amplifiers 148.

According to an alternate embodiment of the present invention, an additional signal (not shown) is provided to the multiplexers of the LYA circuitry 106 to override the selection of only one column by multiplexers 120, 122, 130, and 132, thereby providing a connection to all of the sense amplifiers. Thus, rather than driving a small signal from the I/O connectors 110 to just one sense amplifier, the signal can be driven to all of the sense amplifiers. In doing so, the sense amplifiers can be tested in parallel rather than one at a time, thereby increasing the speed with which the testing can occur.

Additionally, the present invention also provides a tester calibration option. In the illustrated embodiment, the tester calibration option is not performed by providing a command to the LYA control logic 108. However, in alternate embodiments, the tester calibration option can be implemented as another command to the LYA control logic 108.

As illustrated in FIG. 1, a conventional switch 158 is coupled to both I/O connectors 144 and 146. The switch 158 is controlled by a signal received from I/O connector 154 via driver 156. When the DAT mode is not enabled, the signals received from the I/O connector 154 are not provided to the switch 158 by the driver 156. Thus, the switch 158 will not close when the DAT mode is not enabled. However, when the DAT mode is enabled, driver 156 provides signals received via the I/O connector 154 to the switch 158. Thus, in DAT mode a signal can be asserted to the I/O connector 154, thereby causing the switch 158 to close and electrically short together the I/O connectors 144 and 146.

Shorting together the I/O connectors 144 and 146 can be used to calibrate the small signal test controller voltages being used to test the processor 100 when using the LYA strobe mode. It is to be appreciated that the exact use and process of this calibration is dependent on the particular test controller being used, and is well-known to those skilled in the art.

Figure 6:
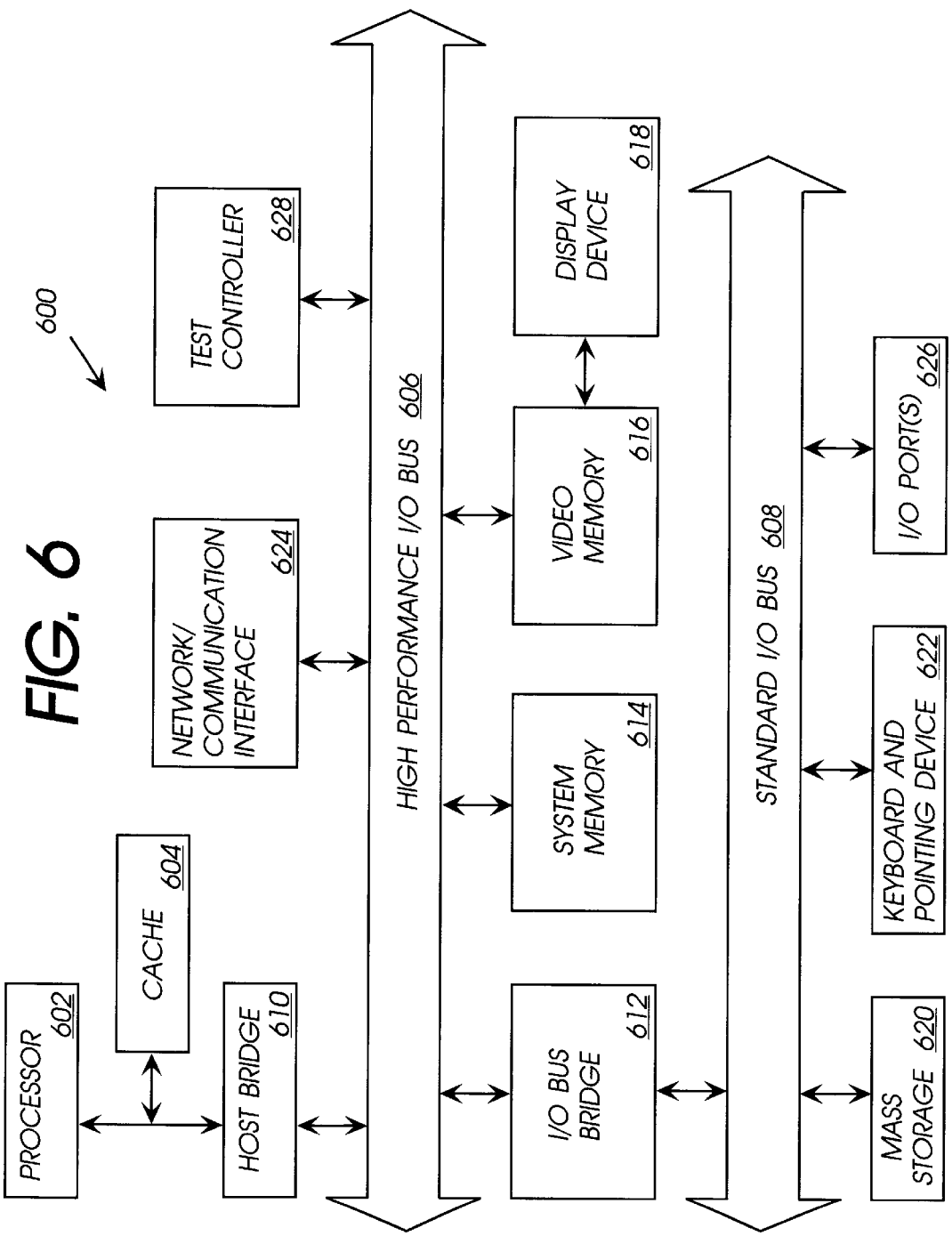
FIG. 6 illustrates a hardware system or machine in which the present invention can be practiced according to one embodiment of the present invention.

FIG. 6 illustrates a hardware system or machine in which the present invention can be practiced according to one embodiment of the present invention. In the illustrated embodiment, hardware system 600 includes processor 602 and cache memory 604 coupled to each other as shown. In one embodiment, processor 602 includes the embedded memory array and associated circuitry of FIG. 1. Additionally, hardware system 600 includes high performance input/output (I/O) bus 606 and standard I/O bus 608. Host bridge 610 couples processor 602 to high performance 110 bus 606, whereas I/O bus bridge 612 couples the two buses 606 and 608 to each other. Coupled to bus 606 are network/communication interface 624, system memory 614, and video memory 616. In turn, display device 618 is coupled to video memory 616. Coupled to bus 608 is mass storage 620, keyboard and pointing device 622, and 110 ports 626. Collectively, these elements are intended to represent a broad category of hardware systems, including but not limited to general purpose computer systems based on the Pentium® processor, Pentium® Pro processor, or Pentium® II processor manufactured by Intel Corporation of Santa Clara, Calif.

These elements 602–626 perform their conventional functions known in the art. In particular, network/communication interface 624 is used to provide communication between system 600 and any of a wide range of conventional networks, such as an Ethernet, token ring, the Internet, etc. It is to be appreciated that the circuitry of interface 624 is dependent on the type of network the system 600 is being coupled to. I/O ports 626 are one or more serial and/or parallel communication ports used to provide communication between additional peripheral devices which may be coupled to hardware system 600.

Test controller 628 provides a user connection to the bus 606 and thus processor 602 for testing purposes. The bus 606 provides a DC connection between the processor 602 and the test controller 628, thereby allowing the driving and sensing of voltages and currents to be performed in accordance with the present invention. According to one embodiment of the present invention address, data, and control signals can be provided to processor 602 by test controller 628 for testing the embedded memory of processor 602, such as by providing LYA control commands to the DAT control logic 107 and potentially analyzing the output from the LYA I/O connectors. Alternatively, the test controller 628 may be an off-system device, to which a processor (or possibly a system, such as a motherboard with processor) is coupled. It is to be appreciated that various components of hardware system 600 may be re-arranged. For example, cache 604 may be on-chip with processor 602. Alternatively, cache 604 and processor 602 may be packaged together as a "processor module" and attached to a "processor card", with processor 602 being referred to as the "processor core". Furthermore, certain implementations of the present invention may not require nor include all of the above components. For example, mass storage 620, keyboard and pointing device 622, display device 618 and video memory 616, host bridge 610, test controller 628, and/or cache 604 may not be included in system 600. Additionally, the peripheral devices shown coupled to standard 110 bus 608 may be coupled to high performance I/O bus 606; in addition, in some implementations only a single bus may exist with the components of hardware system 600 being coupled to the single bus. Furthermore, additional components may be included in system 600, such as additional processors, storage devices, or memories.

References in the discussion above to "one embodiment" or "an embodiment" mean that a particular feature, structure, or characteristic described in connection with the embodiment is included in at least one embodiment of the invention. The appearances of the phrase "in one embodiment" in various places in the specification are not necessarily all referring to the same embodiment.

Also in the discussion above, the present invention is described as being used with embedded memories on a processor. In alternate embodiments, the LYA control logic and circuitry is incorporated into other types of controller chips.

The above discussion describes LYA testability of certain memory arrays within a processor. It is to be appreciated that LYA control logic 108 discussed above could be designed to test only a portion of the embedded arrays discussed or could be designed to test additional embedded arrays. Examples of additional arrays include data and/or instruction parity information, least recently used (LRU) information, etc. Although the present invention makes substantial use of pre-existing hardware and circuitry within the processor, some additional circuitry is required to add LYA testability to different embedded arrays. Which arrays and how many arrays to provide LYA testability to is a matter of design choice, balancing the desire to provide detailed LYA access of (or accurately test) the embedded memories of a processor against the additional cost and chip real estate of adding LYA testability to other arrays.

Also in some of the discussions above, the present invention is described as being used to test at least part of only one embedded memory array in a processor. In alternate embodiments of the present invention, the LYA control logic and circuitry are used to test multiple embedded memory arrays. In one such alternate embodiment, an array identifier is also provided to the LYA control logic as part of certain LYA control commands to identify which particular embedded memory array is to be tested.

In the illustrated embodiment, the LYA circuitry 106 of FIG. 1 is described as including two stages of multiplexers. In alternate embodiments, the number of stages of multiplexers may be increased or decreased, depending on the particular layout and structure of the memory banks 102 and 104, as well as the overall embedded memory structure (e.g., number of sets, number of ways, etc.).

Furthermore, the LYA circuitry 106 of FIG. 1 describes a particular implementation of a decoding strategy to support the testing and evaluation of the electrical characteristics of the memory arrays. It is to be appreciated that alternate implementations using different strategies and different configurations of multiplexers are within the spirit and scope of the present invention.

Therefore, a method and apparatus for electrical testing of embedded memories has been described. The present invention advantageously allows the electrical characteristics of individual memory cells from an embedded memory array to be accessed and tested. Furthermore, the electrical characteristics of the low yield analysis circuitry, as well as the memory array bit lines and the sense amplifiers, can be evaluated by advantageously isolating those portions of the processor.

Thus, a method and apparatus for electrical testing of embedded memory has been described. Whereas many alterations and modifications of the present invention will be comprehended by a person skilled in the art after having read the foregoing description, it is to be understood that the particular embodiments shown and described by way of illustration are in no way intended to be considered limiting. References to details of particular embodiments are not intended to limit the scope of the claims.

What is claimed is:

1. A processor comprising:
   a plurality of I/O connectors;
   an embedded memory array, including a plurality of memory cells and a plurality of bitlines coupled to the plurality of memory cells; and
   low yield analysis circuitry, coupled to both the embedded memory array and a first connector of the plurality of I/O connectors, to provide a bit level, direct current (DC) coupling between a portion of the embedded memory array and the first connector.

2. The processor of claim 1, wherein the portion of the embedded memory array comprises a particular one of the plurality of memory cells.

3. The processor of claim 1, wherein the portion of the embedded memory array comprises a particular set of the plurality of bitlines.

4. The processor of claim 1, further comprising a low yield analysis control logic, coupled to the low yield analysis circuitry and the plurality of I/O connectors, to receive control commands from an external source via the plurality of I/O connectors and assert signals to the embedded memory array and the low yield analysis circuitry in accordance with the control commands.

5. The processor of claim 4, wherein the low yield analysis circuitry further comprises:
   a first stage multiplexer having a plurality of inputs coupled to the plurality of bitlines; and
   a second stage multiplexer having a plurality of inputs coupled to a plurality of outputs of the first stage multiplexer, and having an output coupled to the first I/O connector.

6. The processor of claim 5, wherein the low yield analysis control logic is to enable each of the first stage multiplexer and the second stage multiplexer.

7. The processor of claim 6, wherein the low yield analysis control logic is also to assert a wordline signal to a set of the plurality of memory cells.

8. The processor of claim 7, further comprising a plurality of sense amplifiers coupled to the plurality of memory cells, and wherein the low yield analysis control logic is to assert a strobe signal to each of the plurality of sense amplifiers.

9. The processor of claim 5, wherein the low yield analysis control logic is to enable the second stage multiplexer and disable the first stage multiplexer.

10. The processor of claim 5, further comprising a switch coupled to the first I/O connector and a second I/O connector of the plurality of I/O connectors.

11. The processor of claim 10, wherein the switch is closed to electrically short together the first and second I/O connectors in response to a signal received on a third I/O connector of the plurality of I/O connectors.

12. A system comprising:
   a bus;
   a storage device coupled to the bus; and
   a processor coupled to the bus, the processor including,
      a plurality of I/O connectors coupled to the bus,
      an embedded memory array, including a plurality of memory cells and a plurality of bitlines coupled to the plurality of memory cells, and
      low yield analysis circuitry, coupled to both the embedded memory array and a first connector of the plurality of I/O connectors, to provide a bit level, direct current (DC) coupling between a portion of the embedded memory array and the first connector.

13. The system of claim 12, wherein the processor further comprises a low yield analysis control logic, coupled to the low yield analysis circuitry and the plurality of I/O connectors, to receive control commands from an external source, coupled to the bus, via the plurality of I/O connectors and assert signals to the embedded memory array and the low yield analysis circuitry in accordance with the control commands.

14. The system of claim 13, wherein the low yield analysis circuitry further comprises:
   a first stage multiplexer having a plurality of inputs coupled to the plurality of bitlines; and
   a second stage multiplexer having a plurality of inputs coupled to a plurality of outputs of the first stage multiplexer, and having an output coupled to the first I/O connector.

15. A processor comprising:

means for providing input to and output from the processor;

an embedded memory array, including a plurality of memory cells and a plurality of bitlines coupled to the plurality of memory cells; and analysis means, coupled to both the embedded memory array and the means for providing input to and output from the processor, for providing a bit level, direct cuurent (DC) coupling between a portion of the embedded memory array and a first connector.

16. The processor of claim 15, further comprising means, coupled to the analysis means and a plurality of I/O connectors, for receiving control commands from an external source via the means for providing input to and output from the processor and for asserting signals to the embedded memory array and the analysis means in accordance with the control commands.

17. The processor of claim 16, wherein the analysis means further comprises:

a first stage multiplexing means having a plurality of inputs coupled to the plurality of bitlines; and a second stage multiplexing means having a plurality of inputs coupled to a plurality of outputs of the first stage multiplexing means, and having an output coupled to the means for providing input to and output from the processor.

18. A method, in a processor, comprising:

receiving a low yield analysis control command and control command parameters from a source external to the processor;

enabling low yield analysis circuitry within the processor;

asserting a first signal, based on the control command parameters, to a plurality of multiplexers of the low yield analysis circuitry to couple a first set of inputs to the plurality of multiplexers to the outputs of the plurality of multiplexers; and asserting a second signal, based on the control command parameters, to a plurality of transmission gates to enable a selected one of the plurality of transmission gates to couple the output of one of the plurality of multiplexers to an I/O connector, to provide direct, bit level, direct current (DC) access to memory within the processor.

19. The method of claim 18, further comprising asserting a third signal, based on the control command and the control command parameters, to a plurality of memory banks to couple a selected portion of the plurality of memory banks to the plurality of multiplexers.

20. The method of claim 18, wherein the plurality of multiplexers comprises a first stage of multiplexers and a second stage of multiplexers, further comprising enabling both the first stage of multiplexers and the second stage of multiplexers.

21. The method of claim 18, wherein the plurality of multiplexers comprises a first stage of multiplexers and a second stage of multiplexers, further comprising disabling the first stage of multiplexers and enabling the second stage of multiplexers.

* * * * *

UNITED STATES PATENT AND TRADEMARK OFFICE
CERTIFICATE OF CORRECTION

PATENT NO. : 6,374,377 B1
DATED : April 16, 2002
INVENTOR(S) : Guddat et al.

It is certified that error appears in the above-identified patent and that said Letters Patent is hereby corrected as shown below:

Column 3,
Line 3, delete "low yield an access test" and insert -- low yield analysis (LYA) circuitry 106, direct access test --.

Column 5,
Line 34, delete "110 transmission gate" and insert -- I/O transmission gate --.

Column 8,
Line 52, delete "110 transmission gate" and insert -- I/O transmission gate --.

Column 9,
Line 63, delete "110 transmission gate" and insert -- I/O transmission gate --.

Column 10,
Line 1, delete "110 transmission gate" and insert -- I/O transmission gate --.
Line 45, delete "110 transmission gate" and insert -- I/O transmission gate --.

Signed and Sealed this

Fifteenth Day of October, 2002

*Attest:*

JAMES E. ROGAN
*Attesting Officer*  *Director of the United States Patent and Trademark Office*